United States Patent
Kochar et al.

(10) Patent No.: US 9,195,587 B2
(45) Date of Patent: Nov. 24, 2015

(54) ENHANCED DYNAMIC READ PROCESS WITH SINGLE-LEVEL CELL SEGMENTATION

(71) Applicants: Mrinal Kochar, San Jose, CA (US); Piyush Sagdeo, San Jose, CA (US); Anubhav Khandelwal, Campbell, CA (US)

(72) Inventors: Mrinal Kochar, San Jose, CA (US); Piyush Sagdeo, San Jose, CA (US); Anubhav Khandelwal, Campbell, CA (US)

(73) Assignee: SanDisk Technologies Inc., Plano, TX (US)

( * ) Notice: Subject to any disclaimer, the term of this patent is extended or adjusted under 35 U.S.C. 154(b) by 305 days.

(21) Appl. No.: 13/789,536

(22) Filed: Mar. 7, 2013

(65) Prior Publication Data
US 2014/0258590 A1  Sep. 11, 2014

(51) Int. Cl.
- G06F 12/00 (2006.01)
- G06F 12/02 (2006.01)
- G11C 11/56 (2006.01)
- G11C 16/26 (2006.01)
- G11C 16/34 (2006.01)

(52) U.S. Cl.
CPC ........ G06F 12/0246 (2013.01); G11C 11/5642 (2013.01); G11C 16/26 (2013.01); G11C 16/349 (2013.01); G11C 16/3422 (2013.01)

(58) Field of Classification Search
CPC .............. G06F 12/0246; G11C 16/349; G11C 16/3422; G11C 16/26; G11C 11/5642
See application file for complete search history.

(56) References Cited

U.S. PATENT DOCUMENTS

| | | | |
|---|---|---|---|
| 8,228,728 | B1 | 7/2012 | Yang et al. |
| 2004/0111553 | A1* | 6/2004 | Conley .......................... 711/103 |
| 2005/0144357 | A1 | 6/2005 | Sinclair |
| 2005/0144363 | A1 | 6/2005 | Sinclair |
| 2006/0126383 | A1* | 6/2006 | Shappir et al. ............. 365/185.2 |
| 2007/0091677 | A1 | 4/2007 | Lasser et al. |
| 2009/0003058 | A1 | 1/2009 | Kang |
| 2010/0020611 | A1 | 1/2010 | Park |
| 2011/0149650 | A1* | 6/2011 | Huang et al. ............. 365/185.03 |
| 2012/0063231 | A1 | 3/2012 | Wood et al. |
| 2012/0284574 | A1 | 11/2012 | Avila et al. |

OTHER PUBLICATIONS

PCT International Search Report and Written Opinion, PCT Application No. PCT/US2014/020019, mailed Jul. 18, 2014.

* cited by examiner

*Primary Examiner* — Cheng-Yuan Tseng
*Assistant Examiner* — Alan Otto
(74) *Attorney, Agent, or Firm* — Martine Penilla Group, LLP

(57) ABSTRACT

A dynamic read case designation is determined for each of multiple wordline regions, respectively, of each of a number of single-level cell logic groups within a computer memory. The dynamic read case designation for any given one of the multiple wordline regions specifies a wordline read voltage to be used in reading memory cells of each wordline within the given one of the multiple wordline regions. The number of single-level cell logic groups are folded into a multi-level cell block. The folding includes reading the memory cells of each wordline of each of the multiple wordline regions of each of the number of single-level cell logic groups using a wordline read voltage corresponding to the dynamic read case designation, as determined for the wordline region within which the read memory cells reside.

20 Claims, 10 Drawing Sheets

| Case # | V_READ (mV) |
|---|---|
| 0 (default) | 0 |
| 1 | +400 |
| 2 | -400 |
| 3 | -200 |
| 4 | +200 |
| 5 | -600 |
| 6 | +600 |
| 7 | -800 |
| 8 | +800 |
| 9 | +1000 |
| 10 | +1200 |
| 11 | -1000 |
| 12 | -1200 |

Fig. 5

| File System Parameters |
|---|
| • Sampling WL for Region 0 |
| • Ending WL for Region 0 |
| • Sampling WL for Region 1 |
| • Ending WL for Region 1 |
| • Sampling WL for Region 2 |

Fig. 8

ENHANCED DYNAMIC READ PROCESS WITH SINGLE-LEVEL CELL SEGMENTATION

BACKGROUND

Non-volatile Flash memory systems are widely used in modern digital computing devices, such as mobile phones, digital cameras, digital camcorders, computers, and many other digital computing devices. Flash memory systems utilize floating gate transistor memory cells. FIG. 1 shows a typical floating gate memory cell 100 that would be found in many Flash memory systems. The memory cell 100 includes a first source/drain region 105 and a second source/drain region 107. The source/drain regions 105/107 are n+ doped regions formed within a p+ well 111 within a substrate 113. A floating gate 109 and contacted gate 101 are formed between the source/drain regions 105/107. The floating gate 109 is encapsulated in an insulating material 115, such as an oxide, e.g., SiO2. The contacted gate 101 is positioned above and close to, but separated from the floating gate 109. The contacted gate 101 is connected to a conductor 103 of a circuit net.

The floating gate 109 functions as an electron trap to hold a charge present thereon. When the memory cell 100 is programmed, electrons are injected into the floating gate 109. When the memory cell 100 is erased, electrons are removed from the floating gate 109. A change in the number of electrons present in the floating gate 109 causes a change in the threshold voltage $V_{TH}$ of the memory cell 100. When a fixed voltage is applied to the source/drain regions 105/107 of the memory cell 100, a read voltage can be applied to the contacted gate 101 to determine whether or not the memory cell 100 turns on, depending on the threshold voltage $V_{TH}$ of the memory cell 100, which in turn depends on the programmed status of the floating gate 109. If the read voltage applied to the contacted gate 101 is equal to or greater than the existing threshold voltage $V_{TH}$, the memory cell will turn on, thereby indicating a stored/programmed digital state of "1." If the read voltage applied to the contacted gate 101 is less than the existing threshold voltage $V_{TH}$, the memory cell will turn not on, thereby indicating a stored/programmed digital state of "0."

Over the functional lifetime of the memory cell 100, the ability of the floating gate 109 to retain a programmed charge diminishes. For example, the charge retention ability of the floating gate 109 may diminish as the number of program/erase cycles increases during use of the memory cell 100. The charge retention by the floating gate 109 directly affects the programmed threshold voltage $V_{TH}$ of the memory cell 100. Therefore, over the functional lifetime of the memory cell 100 it is necessary to manage the variation in its charge retention capability in order to ensure the integrity of data read from the memory cell 100. It is within this context that the present invention arises.

SUMMARY

In one embodiment, a method is disclosed for operating a computer memory. The method includes determining a dynamic read case designation for each of multiple wordline regions, respectively, of each of a number of single-level cell logic groups. The dynamic read case designation for any given one of the multiple wordline regions specifies a wordline read voltage to be used in reading memory cells of each wordline within the given one of the multiple wordline regions. The method also includes folding the number of single-level cell logic groups into a multi-level cell block. The folding includes reading the memory cells of each wordline of each of the multiple wordline regions of each of the number of single-level cell logic groups using a wordline read voltage corresponding to the dynamic read case designation, as determined for the wordline region within which the read memory cells reside.

In another embodiment, a method is disclosed for provisioning a computer memory. The method includes segmenting a single-level cell logic group into multiple wordline regions. The method also includes storing a specification of the multiple wordline regions as file system parameters in a firmware of the computer memory. The method also includes designating a sampling wordline for each of the multiple wordline regions. The sampling wordline of a given wordline region is to be used during performance of a dynamic read process on the given wordline region. The method also includes storing a specification of the designated sampling wordline for each of the multiple wordline regions in the firmware of the computer memory.

In another embodiment, a computer memory system is disclosed. The computer memory system includes a NAND-based memory structure including single-level cell logic groups and multi-level cell blocks. The computer memory system also includes a non-volatile memory having firmware data stored therein. The firmware data includes file system parameter values and file system operating program instructions. The file system parameter values include a specification of multiple wordline regions for each of the single-level cell logic groups and a specification of a sampling wordline for each of the multiple wordline regions. The file system operating program instructions are defined to respectively determine a dynamic read case designation for each of the multiple wordline regions of a number of the single-level cell logic groups by reading the sampling wordlines for the multiple wordline regions as specified in the file system parameters. The file system operating program instructions are also defined to fold the number of the single-level cell logic groups into one of the multi-level cell blocks. The folding includes reading memory cells of each wordline of each of the multiple wordline regions of each of the number of the single-level cell logic groups using a wordline read voltage corresponding to the dynamic read case designation determined for the wordline region within which the read memory cells reside.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 5 shows an example dynamic read adjustment table, in accordance with one embodiment of the present invention.

FIG. 8 shows an example storage of segmentation parameters for the SLC logic group of FIG. 7 in the file system parameters of the memory system firmware, in accordance with one embodiment of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
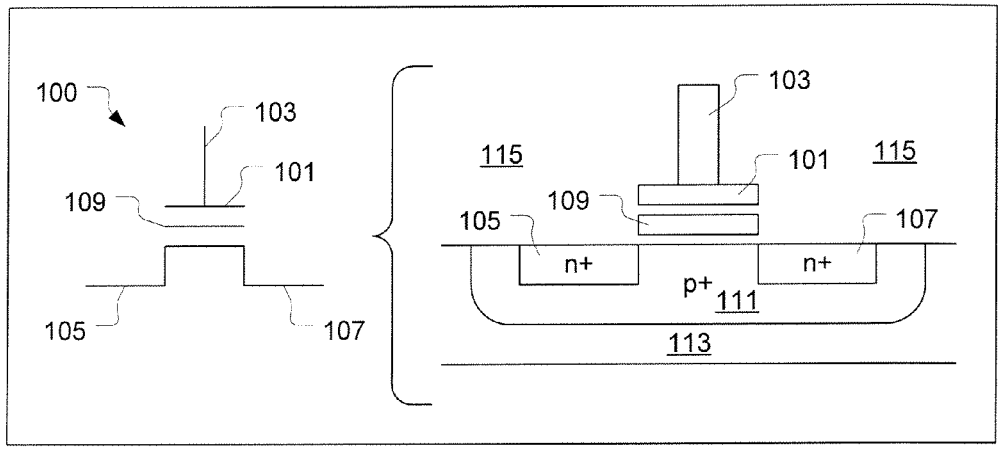
FIG. 1 shows a typical floating gate memory cell that would be found in many Flash memory systems.
Figure 2:
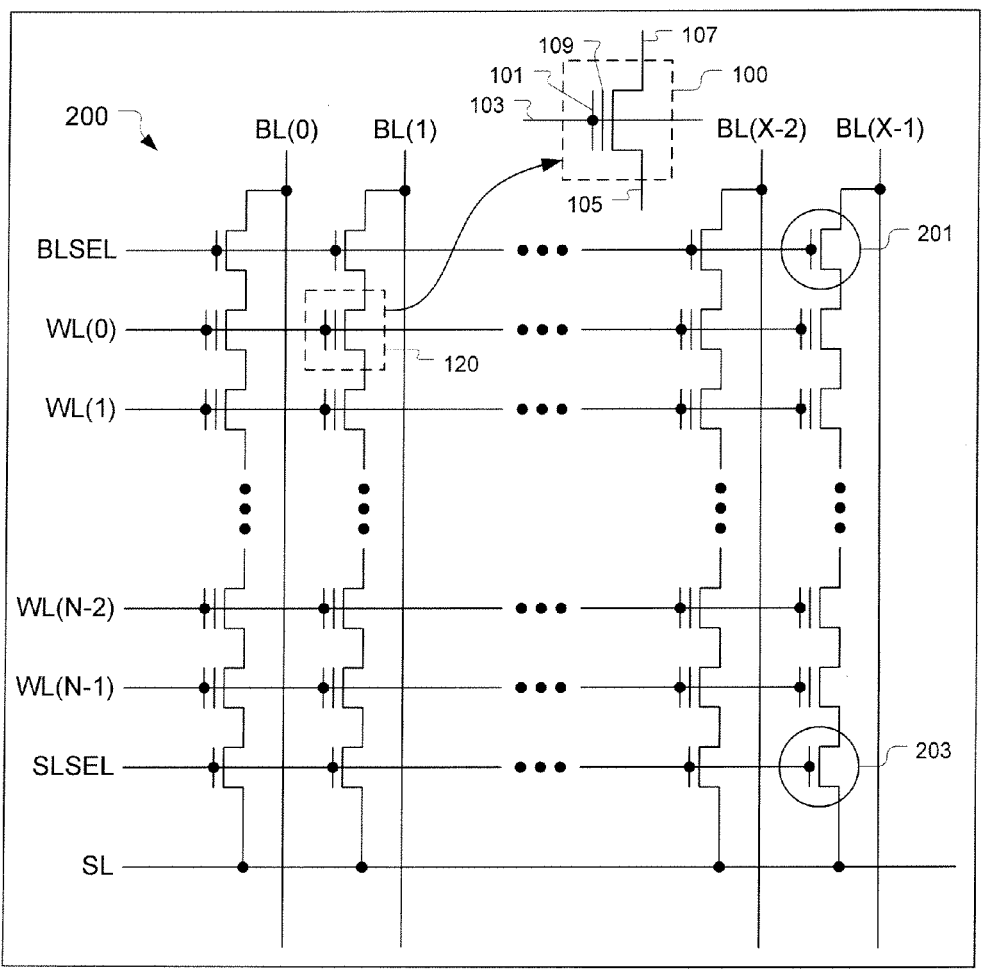
FIG. 2 shows a generalized schematic of a NAND-based Flash memory array, in accordance with one embodiment of the present invention.

FIG. 2 shows a generalized schematic of a NAND-based Flash memory array 200, in accordance with one embodiment of the present invention. The memory array 200 includes a number of memory cells 100, a number N of wordlines (WL (0) through WL(N−1)), and a number of bitlines X (BL(0) through BL(X−1)), such at a memory cell 100 is positioned at the intersection of each wordline and each bitline. Each memory cell 100 associated with a given wordline has its contacted gate 101 connected to the given wordline. Also, each memory cell 100 associated with a given bitline is connected in a serial manner, i.e., source/drain region-to-source/drain region, to form a NAND string. A first end of the NAND string at a wordline location WL(0) has its outer source/drain region connected to the corresponding bitline. A second end of the NAND string at a wordline location WL(N−1) has its outer source/drain region connected to a source line. Each NAND string also includes a bitline select transistor 201 having its gate connected to a bitline select conductor BLSEL to provide control of connection between the NAND string and its corresponding bitline. Similarly, each NAND string also includes a source line select transistor 203 having its gate connected to a source line select conductor SLSEL to provide control of connection between the NAND string and the source line. Appropriate voltages are applied to the various wordlines, bitlines, source line, bitline select transistors, and source line select transistors in order to perform read operations, program operation, and erase operations on the memory cells 100.

During a read operation, a wordline read voltage $V_{READ}$ is applied to the wordline that addresses the memory cell 100 to be read, while a pass voltage $V_{PASS}$ is applied to the other wordlines in the memory array 200. The pass voltage $V_{PASS}$ is set at a voltage level to cause the memory cells to function as pass transistors. In one example embodiment, the pass voltage $V_{PASS}$ is within a range of 4 to 5 Volts. However, it should be understood that the pass voltage $V_{PASS}$ is dependent on the memory cell design. Also, in one example embodiment, the default wordline read voltage $V_{READ}$ is 0 Volts. During the read operation, the series of memory cells 100 in the NAND string will conduct current only if the addressed memory cell is erased. Thus, a presence of current on the bitline of the NAND string during the read operation, i.e., sensing a digital state of "1," indicates that the addressed memory cell is erased. And, an absence of current on the bitline of the NAND string during the read operation, i.e., sensing a digital state of "0," indicates that the addressed memory cell is programmed.

Figure 3A:
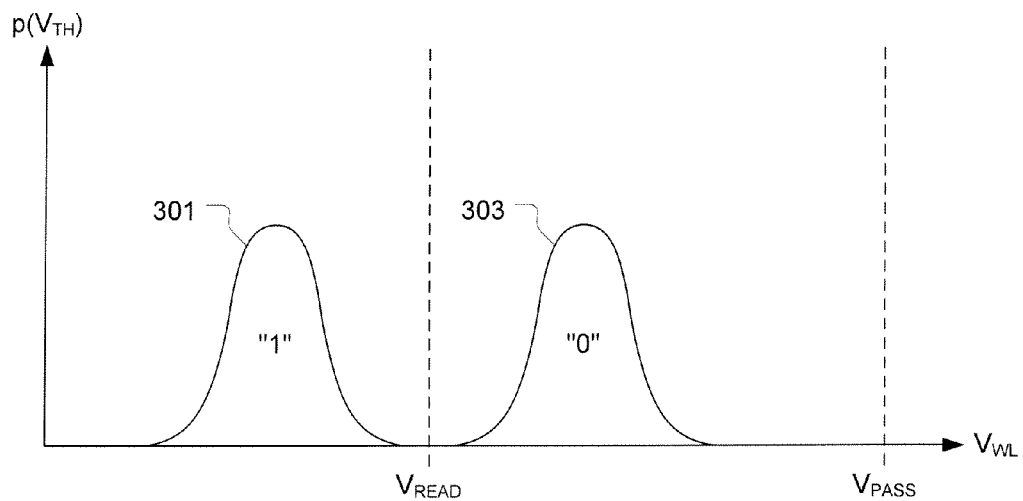
FIG. 3A shows a diagram depicting the voltage relationships of the read operation. The threshold voltage $V_{TH}$ of the memory cell at a given time can be described as falling within a threshold voltage level $V_{TH}$ distribution.

FIG. 3A shows a diagram depicting the voltage relationships of the read operation. The threshold voltage $V_{TH}$ of the memory cell 100 at a given time can be described as falling within a threshold voltage level $V_{TH}$ distribution. FIG. 3A shows a first threshold voltage $V_{TH}$ level distribution 301 corresponding to an erased state of the memory cell 100, and a second threshold voltage $V_{TH}$ level distribution 303 corresponding to a programmed state of the memory cell 100. FIG. 3A also depicts the wordline read voltage $V_{READ}$ in an ideal relationship with both the first threshold voltage $V_{TH}$ level distribution 301 corresponding to the erased state and the second threshold voltage $V_{TH}$ level distribution 303 corresponding to the programmed state.

When the memory cell 100 erased, the threshold voltage $V_{TH}$ of the memory cell is defined by the first threshold voltage $V_{TH}$ level distribution 301. Therefore, because the wordline read voltage $V_{READ}$ is greater than the threshold voltage $V_{TH}$ of the memory cell in the erased state, the memory cell in the erased state will turn on when the wordline read voltage $V_{READ}$ is applied to the contacted gate of the memory cell, thereby allowing current to be sensed on the corresponding bitline. Conversely, when the memory cell 100 is programmed, the threshold voltage $V_{TH}$ of the memory cell is defined by the second threshold voltage $V_{TH}$ level distribution 303. Therefore, because the wordline read voltage $V_{READ}$ is less than the threshold voltage $V_{TH}$ of the memory cell in the programmed state, the memory cell in the programmed state will not turn on when the wordline read voltage $V_{READ}$ is applied to the contacted gate of the memory cell, thereby preventing current from being sensed on the corresponding bitline.

The threshold voltage $V_{TH}$ distributions of the memory cell can be adversely affected by a number of phenomena during the functional lifetime of the memory cell, such as the number of program/erase cycles performed, program disturbs due to programming of other memory cells on the shared wordline, and pass disturbs due to application of the pass voltage to other memory cells on the shared bitline of the NAND string during reading operations. Disturbance of the threshold voltage $V_{TH}$ distributions of the memory cell may cause the threshold voltage $V_{TH}$ distributions to shift relative to what is believed to be an appropriate wordline read voltage $V_{READ}$ level. When this threshold voltage $V_{TH}$ distribution shift occurs, use of the previously defined wordline read voltage $V_{READ}$ may cause incorrect current sensing on the bitline, and misreading of the true programmed state of the memory cell.

Figure 3B:
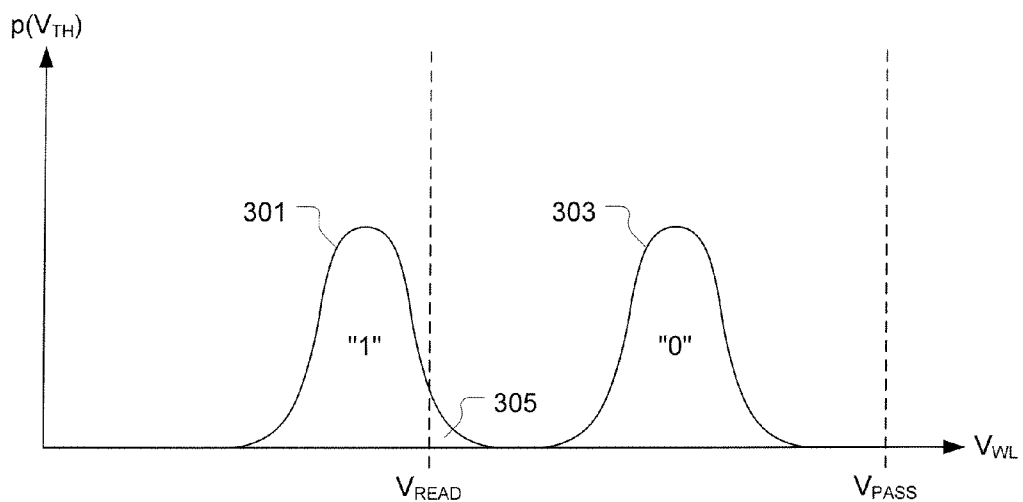
FIG. 3B shows the voltage relationship diagram of FIG. 3A in which the threshold voltage $V_{TH}$ distributions of the memory cell have been shifted toward higher voltage.

For example, FIG. 3B shows the voltage relationship diagram of FIG. 3A in which the threshold voltage $V_{TH}$ distributions 301 and 303 of the memory cell have been shifted toward higher voltage. In this instance, a probability 305 exists that the threshold voltage $V_{TH}$ of the memory cell in the erased state has shifted higher than the wordline read voltage $V_{READ}$. If the threshold voltage $V_{TH}$ of the memory cell in the erased state has in fact shifted higher than the wordline read voltage $V_{READ}$, the memory cell will be misread as being in the programmed state, thereby causing a data error.

Figure 3C:
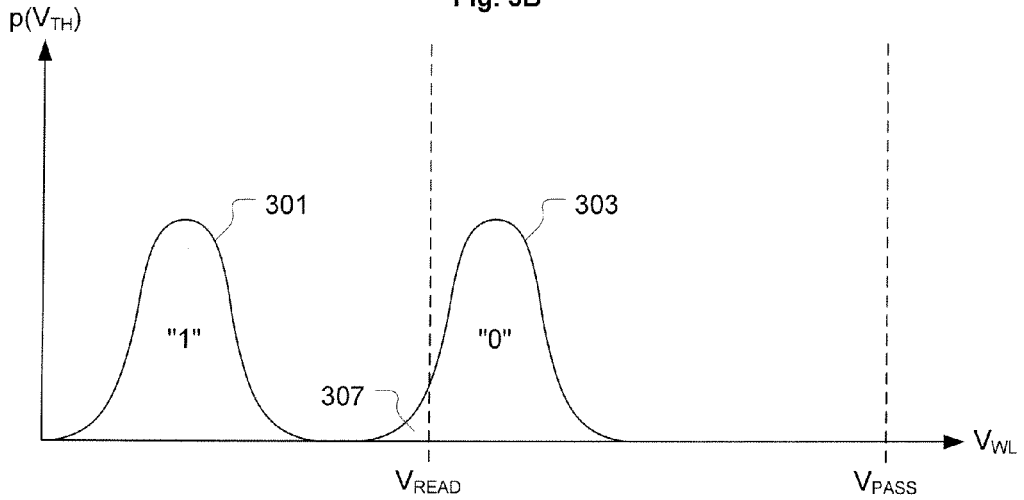
FIG. 3C shows the voltage relationship diagram of FIG. 3A in which the threshold voltage $V_{TH}$ distributions of the memory cell have been shifted toward lower voltage.

Similarly, FIG. 3C shows the voltage relationship diagram of FIG. 3A in which the threshold voltage $V_{TH}$ distributions 301 and 303 of the memory cell have been shifted toward lower voltage. In this instance, a probability 307 exists that the threshold voltage $V_{TH}$ of the memory cell in the programmed state has shifted lower than the wordline read voltage $V_{READ}$. If the threshold voltage $V_{TH}$ of the memory cell in the programmed state has in fact shifted lower than the wordline read voltage $V_{READ}$, the memory cell will be misread as being in the erased state, thereby causing a data error.

Figure 4:
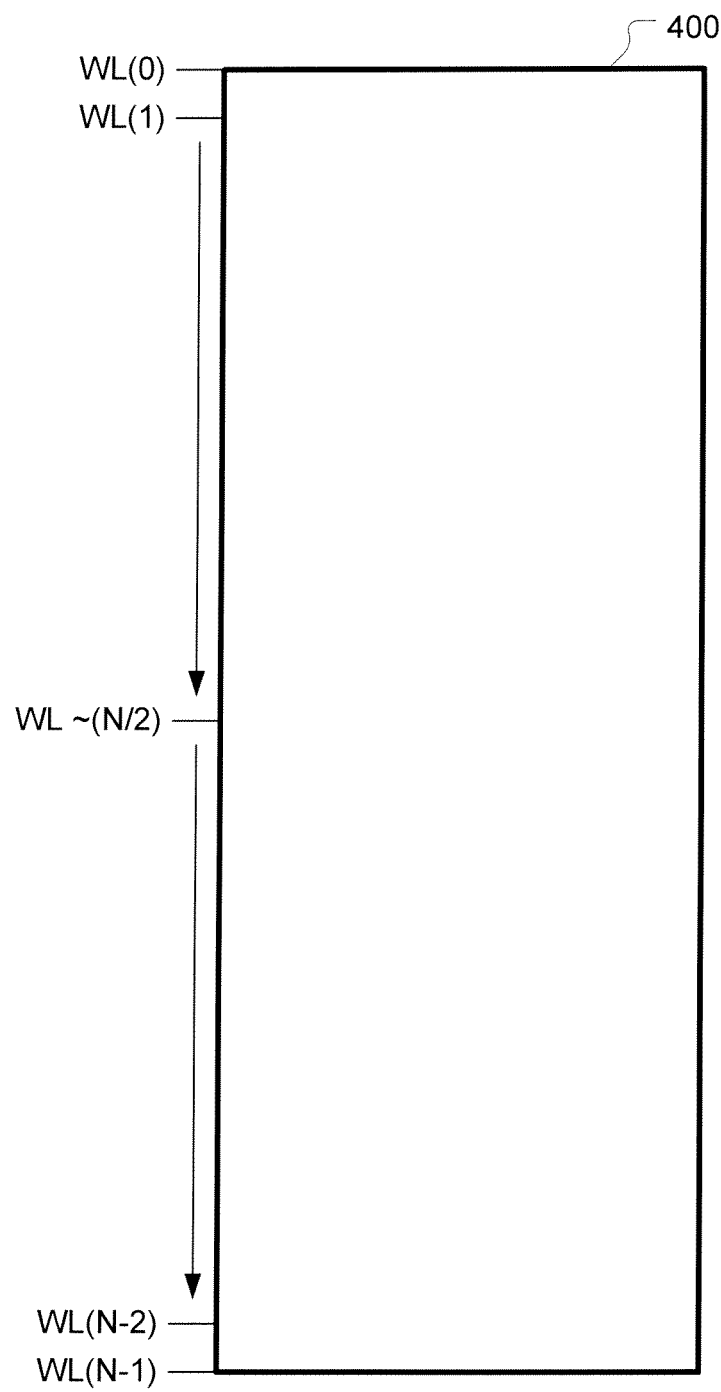
FIG. 4 shows a diagram of a logic group than includes N wordlines.

To compensate for the potential change in memory cell threshold voltage $V_{TH}$ distributions, a dynamic read process is performed in which the wordline read voltage $V_{READ}$ is adjusted based on data error detection. In the dynamic read process, a single representative wordline is selected for a logic group of memory cells, where the logic group includes a set number of wordlines. For example, FIG. 4 shows a diagram of a logic group 400 than includes N wordlines. The single representative wordline is generally selected from about the center wordline position of the logic group, e.g., WL~(N/2) as shown in the example logic group 400 of FIG. 4. In the dynamic read process, this single representative wordline is first read using the default wordline read voltage $V_{READ}$ (default). Then, the read data for the single representative wordline is put through an error correction code (ECC) checking process to determine a fail bit count (FBC) within the read data, i.e., how many memory cells were read incorrectly. If the FBC is greater than a specified limit, the wordline read voltage $V_{READ}$ is adjusted in accordance with a predefined adjustment table. FIG. 5 shows an example dynamic read adjustment table, in accordance with one embodiment of the present invention. In this example, there are 12 dynamic read cases in addition to the default dynamic read case, where each dynamic read case specifies a different wordline read voltage $V_{READ}$ to be used.

Once the wordline read voltage $V_{READ}$ is adjusted, the single representative wordline is read again using the adjusted wordline read voltage $V_{READ}$, and the read data is put through the ECC checking process to determine the corresponding FBC. If the FBC is less than the specified limit, the dynamic read process stops, and the current adjusted wordline read voltage $V_{READ}$ is used for reading all wordlines of the logic group 400. If the FBC is greater than or equal to the specified limit, the dynamic read process continues by setting the wordline read voltage $V_{READ}$ to that of the next dynamic read case, and repeating the reading and ECC checking of the single representative wordline. This process continues until either the determined FBC for a given dynamic read case is less than the specified limit or until the last dynamic read case is tried. In this manner the wordline read voltage $V_{READ}$ can be dynamically adjusted to track changes that may occur in the memory cell threshold voltage $V_{TH}$ distributions.

However, there may be instances in which use of a single representative wordline is not sufficient to accurately represent an entire logic group. More specifically, it may happen that the changes in memory cell threshold voltage $V_{TH}$ distributions of some wordlines in a given logic group are sufficiently different from other wordlines in the given logic group such that more than one wordline read voltage $V_{READ}$ is required. For example, wordlines near one or more edges of the logic group behave differently that wordlines within a central region of the logic group. This may occur because random access patterns subject a number of wordlines near a beginning of the logic group to more program/erase cycles as compared to other wordlines in the logic group. Also, partial logic group program/erase cycling can cause a shallower erase depth on wordlines closer to the beginning of the logic group, thereby leading to higher FBCs on the wordlines closer to the beginning of the logic group. To manage this situation, embodiments are disclosed herein for an enhanced dynamic read process in which a given logic group is segmented into multiple wordline regions, with each wordline region having its own representative wordline, i.e., sampling wordline, to be used in the dynamic read process, thereby enabling determination and use of separate wordline read voltages $V_{READ}$ for each wordline region.

Figure 6:
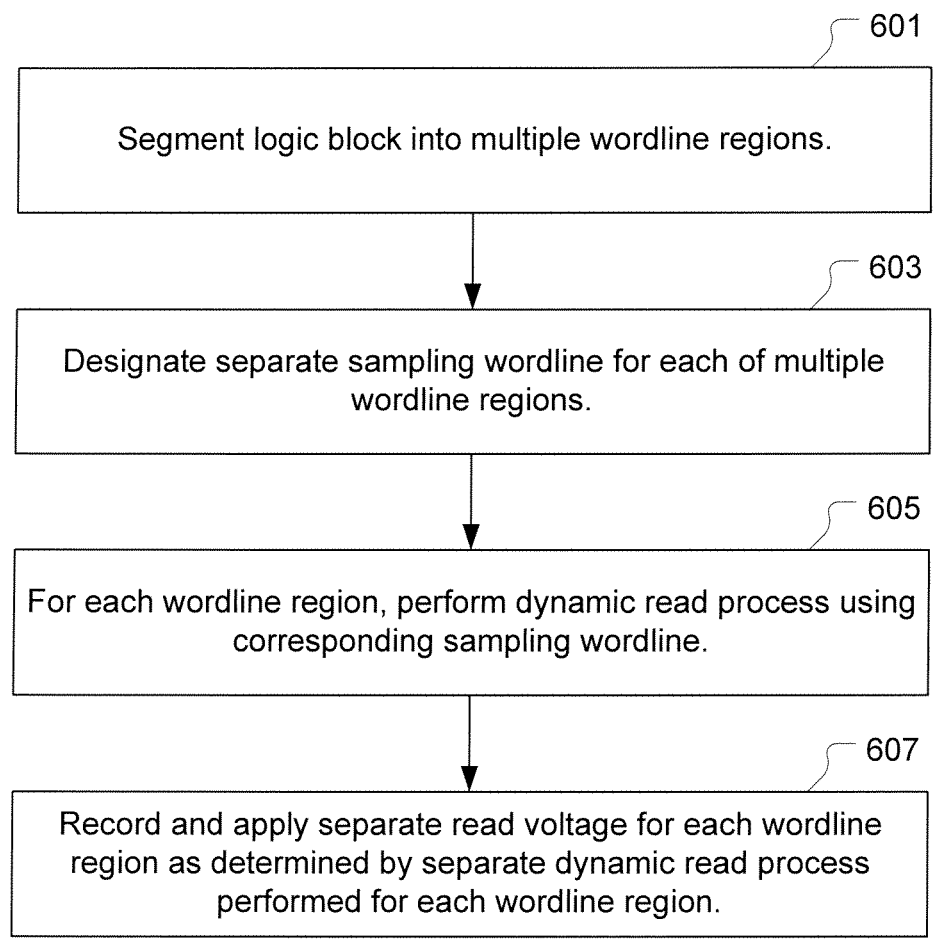
FIG. 6 shows a flowchart of a method for an enhanced dynamic read process using logic group segmentation, in accordance with one embodiment of the present invention.
Figure 7:
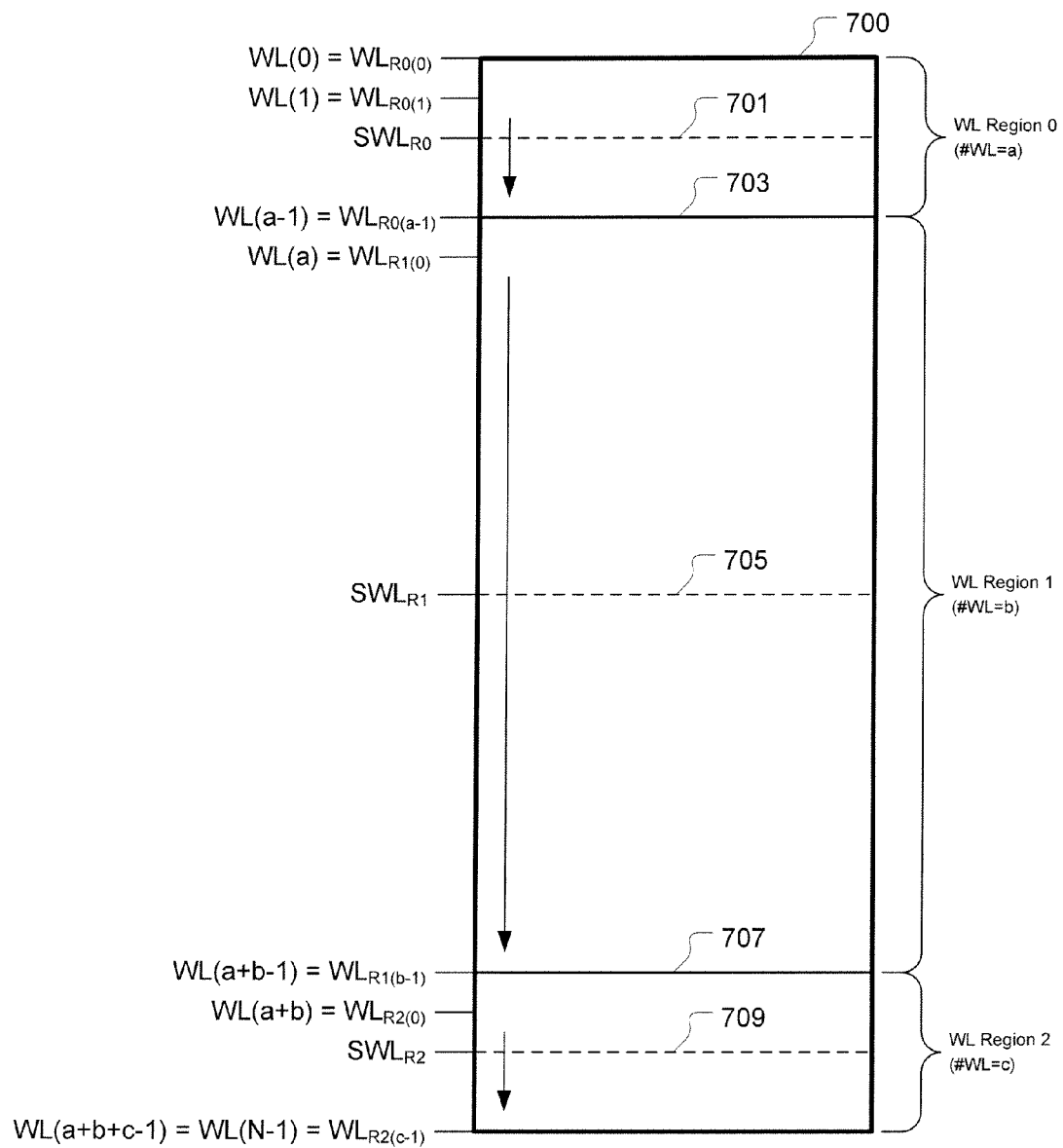
FIG. 7 shows an SLC logic group segmented into three wordline regions (Region 0, Region 1, and Region 2), in accordance with one example embodiment of the present invention.

FIG. 6 shows a flowchart of a method for an enhanced dynamic read process using logic group segmentation, in accordance with one embodiment of the present invention. It should be understood that the logic group referred to in this method is a single-level cell (SLC) logic group within a NAND-based Flash memory system. The method includes an operation 601 in which the SLC logic group is segmented into multiple wordline regions. FIG. 7 shows an SLC logic group 700 segmented into three wordline regions (Region 0, Region 1, and Region 2), in accordance with one example embodiment of the present invention. It should be understood that the interior of the SLC logic group 700 includes an array of memory cells 100, such as previously discussed with regard to FIG. 2. It should be further understood that segmentation of the SLC logic group 700 into three wordline region is shown by way of example. In other embodiments, the SLC logic group 700 can be segmented into more or less than three wordline regions, depending on what is necessary to address the variation in memory cell threshold voltage $V_{TH}$ distributions across the SLC logic group 700, so as to obtain acceptable FBC results for all wordlines with the SLC logic group 700.

In the example SLC logic group 700, wordline (WL) Region 1 is defined to include a number (a) of wordlines, WL Region 1 is defined to include a number (b) of wordlines, and WL Region 1 is defined to include a number (c) of wordlines. WL Region 1 includes wordlines WL(0) through WL(a−1) 703. WL Region 1 includes wordlines WL(a) through WL(a+b−1) 707. WL Region 2 includes wordlines WL(a+b) through WL(N−1), wherein N is the total number of wordlines in the SLC logic group 700, i.e., N=a+b+c. In one embodiment, the wordlines in the SLC logic group are segmented such that (N=85), (a=3), (b=80), and (c=2). However, it should be understood that the enhanced dynamic read process with segmentation of the logic group as described herein can be applied to an SLC logic group having any total number of wordlines, with any segmentation scheme applied thereto.

Referring back to FIG. 6, the method continues with an operation 603 in which a sampling wordline is designated for each of the multiple wordline regions. The sampling wordline of a given wordline region is the wordline that will be read and ECC checked in performing the dynamic read process on the given wordline region. The $V_{READ}$ result for the sampling wordline region of the given wordline region is applied to all other wordlines within the given wordline region. FIG. 7 shows the WL Region 0 to have a designated sampling wordline $SWL_{R0}$ 701, WL Region 1 to have a designated sampling wordline $SWL_{R1}$ 705, and WL Region 2 to have a designated sampling wordline $SWL_{R2}$ 709. In one embodiment, the sampling wordline of a given wordline region is designated as a wordline closest to a wordline midpoint of the given wordline region. In this embodiment, the sampling wordline $SWL_{R0}$ of WL Region 0 will be the wordline closest to WL(a/2). And, the sampling wordline $SWL_{R1}$ of WL Region 1 will be the wordline closest to WL(a+(b/2)). And, the sampling wordline $SWL_{R2}$ of WL Region 2 will be the wordline closest to WL(a+b+(c/2)).

The SLC logic group 700 segmentation definition is stored within the file system parameters in the firmware of the memory system. FIG. 8 shows an example storage of segmentation parameters for the SLC logic group 700 in the file system parameters of the memory system firmware, in accordance with one embodiment of the present invention. The segmentation parameters include a parameter identifying the sampling wordline for Region 0, a parameter identifying the ending wordline for Region 0, a parameter identifying the sampling wordline for Region 1, a parameter identifying the ending wordline for Region 1, and a parameter for identifying the sampling wordline for Region 2. In this embodiment, the memory system is defined to know that Region 0 begins with the first wordline of the SLC logic group 700 and Region 2 end with the last wordline of the SLC logic group 700. It should be appreciated that in other embodiments the storage of segmentation parameters for the SLC logic group 700 can be done in different ways, so long as the boundaries of each of the multiple wordline regions are identified/known and the sampling wordline of each of the multiple wordline regions is identified.

With reference back to FIG. 6, the method proceeds with an operation 605 in which the dynamic read process is performed separately for each of the multiple wordline regions using the corresponding sampling wordline. For example, with regard to the SLC logic group 700, the dynamic read process is first performed on Region 0 by reading the sampling wordline $SWL_{R0}$, performing ECC checking on the read data to determine the FBC, and by incrementing through the wordline read voltages $V_{READ}$ in the applicable dynamic read case table, e.g., as shown in FIG. 5, until a successful dynamic read case is tried where the determined FBC for the sampling wordline $SWL_{R0}$ passes the preset dynamic read acceptance criteria (which is also stored in the firmware of the memory system). Then, the dynamic read process is performed on Region 1 by reading the sampling wordline $SWL_{R1}$, performing ECC checking on the read data to determine the FBC, and by incrementing through the wordline read voltages $V_{READ}$ in the applicable dynamic read case table until a successful dynamic read case is tried where the determined FBC for the sampling wordline $SWL_{R1}$ passes the preset dynamic read acceptance criteria. Then, the dynamic read process is performed on Region 2 by reading the sampling wordline $SWL_{R2}$, performing ECC checking on the read data to determine the FBC, and by incrementing through the wordline read voltages $V_{READ}$ in the applicable dynamic read case table until a successful dynamic read case is tried where the determined FBC for the sampling wordline $SWL_{R2}$ passes the preset dynamic read acceptance criteria.

The method also includes an operation 607 in which the successful dynamic read case for each of the multiple wordline regions is recorded. The wordline read voltage $V_{READ}$ specified by the successful dynamic read case for the sampling wordline of a given wordline region is used to read each wordline in the given wordline region. In this manner, each wordline region of the SLC logic group has its own applicable dynamic read case specifying its own applicable wordline read voltage $V_{READ}$. Therefore, when the SLC logic group is segmented based on a reduced variation among the threshold voltage $V_{TH}$ distributions within a given wordline region, the enhanced dynamic read process will provide for determination and use of more representative wordline read voltages $V_{READ}$ across the SLC logic group. In other words, segmentation of the SLC logic group into multiple wordline regions for purposes of the enhanced dynamic read process allows for grouping of similar behaving wordlines into the same wordline region and sampling of the most representative wordline from within that group of similar behaving wordlines.

Figure 9A:
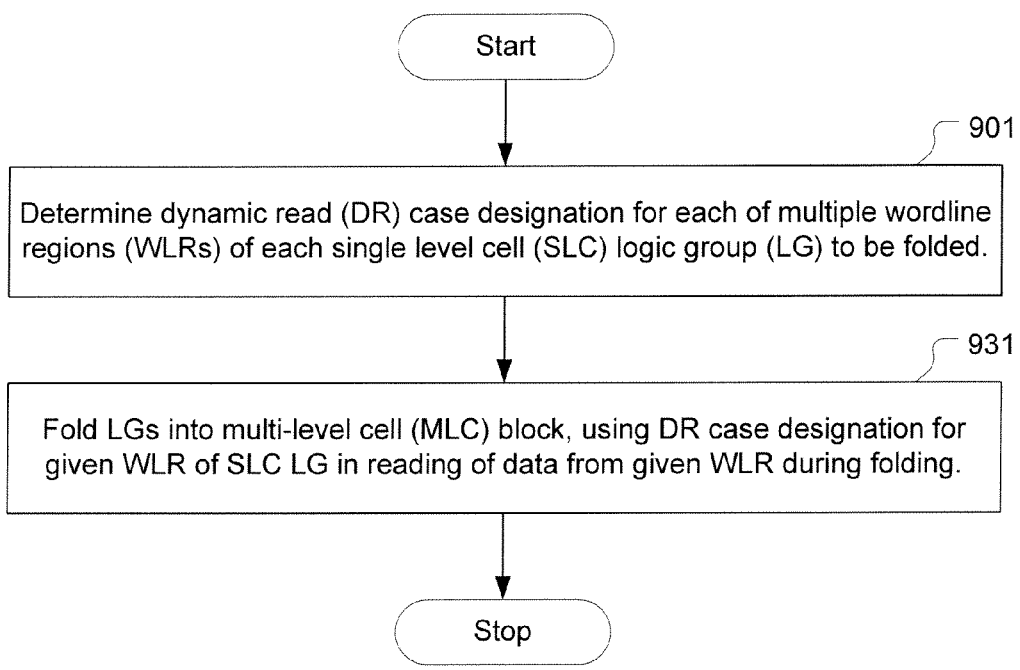
FIG. 9A shows a flowchart of a method for folding, i.e., copying with enhanced dynamic read, a number of SLC logic groups into a multi-level cell (MLC) block, in accordance with one embodiment of the present invention.

FIG. 9A shows a flowchart of a method for folding, i.e., copying with enhanced dynamic read, a number of SLC logic groups into a multi-level cell (MLC) block, in accordance with one embodiment of the present invention. In one embodiment, three SLC logic groups are folded into one MLC block using the method of FIG. 9A. However, it should be understood that in other embodiments, essentially any number of SLC logic groups can be folded into an MLC block so long as the MLC block has a sufficient data storage capacity to accommodate the data present within the number of SLC logic groups to be folded.

Figure 10:
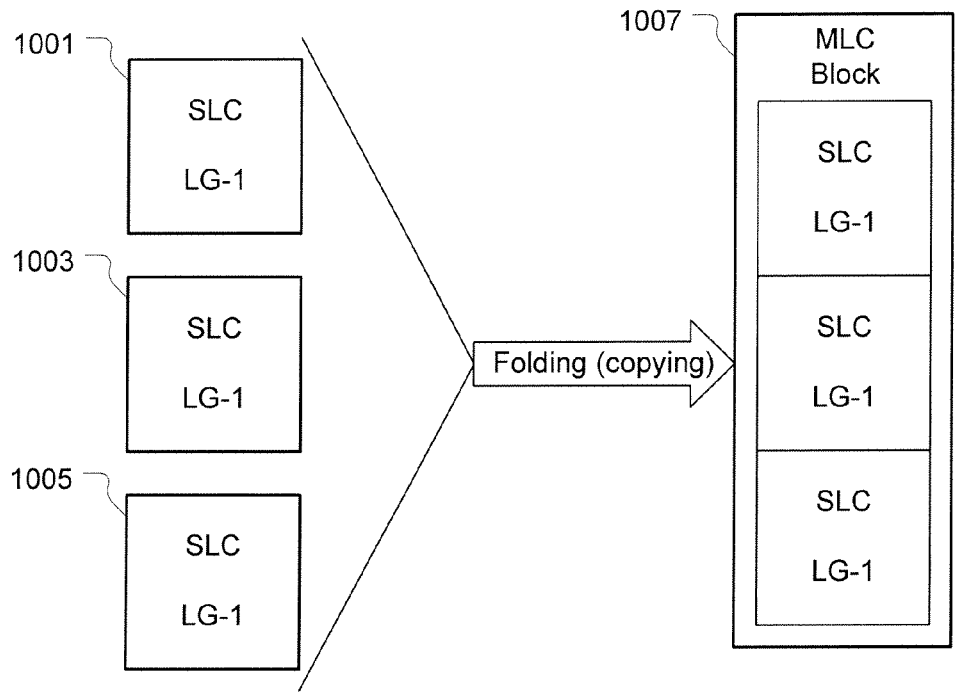
FIG. 10 shows a schematic of folding three SLC logic groups into one MLC block, in accordance with one example embodiment of the present invention.

FIG. 10 shows a schematic of folding three SLC logic groups into one MLC block, in accordance with one example embodiment of the present invention. Specifically, FIG. 10 depicts folding, i.e., copying, of data from a first SLC logic group 1001, a second SLC logic group 1003, and a third SLC logic group 1005 into an MLC block 1007. During the folding operation, data stored in the SLC logic groups is transferred, i.e., copied, to the MLC block. This transfer of data is performed by reading the data from the SLC logic groups and programming the data as-read into the MLC block, without perform Lance of ECC checking. In one embodiment, to obtain higher performance, the folding operation is performed by blindly copying the data from the SLC logic group to the MLC block using internal NAND latches.

Referring back to FIG. 9A, the method includes an operation 901 for determining a dynamic read case designation for each of multiple wordline regions of each SLC logic group to be folded into the MLC block. The determined dynamic read case designation for a given wordline region is used to read the data from the given wordline region during the folding operation. Once the dynamic read case designation is determined for each of the multiple wordline regions of each SLC logic group to be folded, the method proceeds with an operation 931 to fold the SLC logic groups into the MLC block. During the folding operation, the dynamic read case designated for each wordline region of each SLC logic group is used to read the data stored in that wordline region of the SLC logic group for subsequent programming into the MLC block.

It should be understood that the method of FIG. 9A can also include an operation for accessing a file system to read parameter values to determine wordline boundaries of each of the multiple wordline regions of each SLC logic group, as well as the sampling wordline for each of the multiple wordline regions. In this manner, the parameter values specifying the wordline boundaries and sampling wordlines of the multiple wordline regions can be adjusted, if needed, as the memory system technology changes, such as when the memory system transitions to a smaller technology node, i.e., to smaller transistor device feature sizes.

Figure 9B:
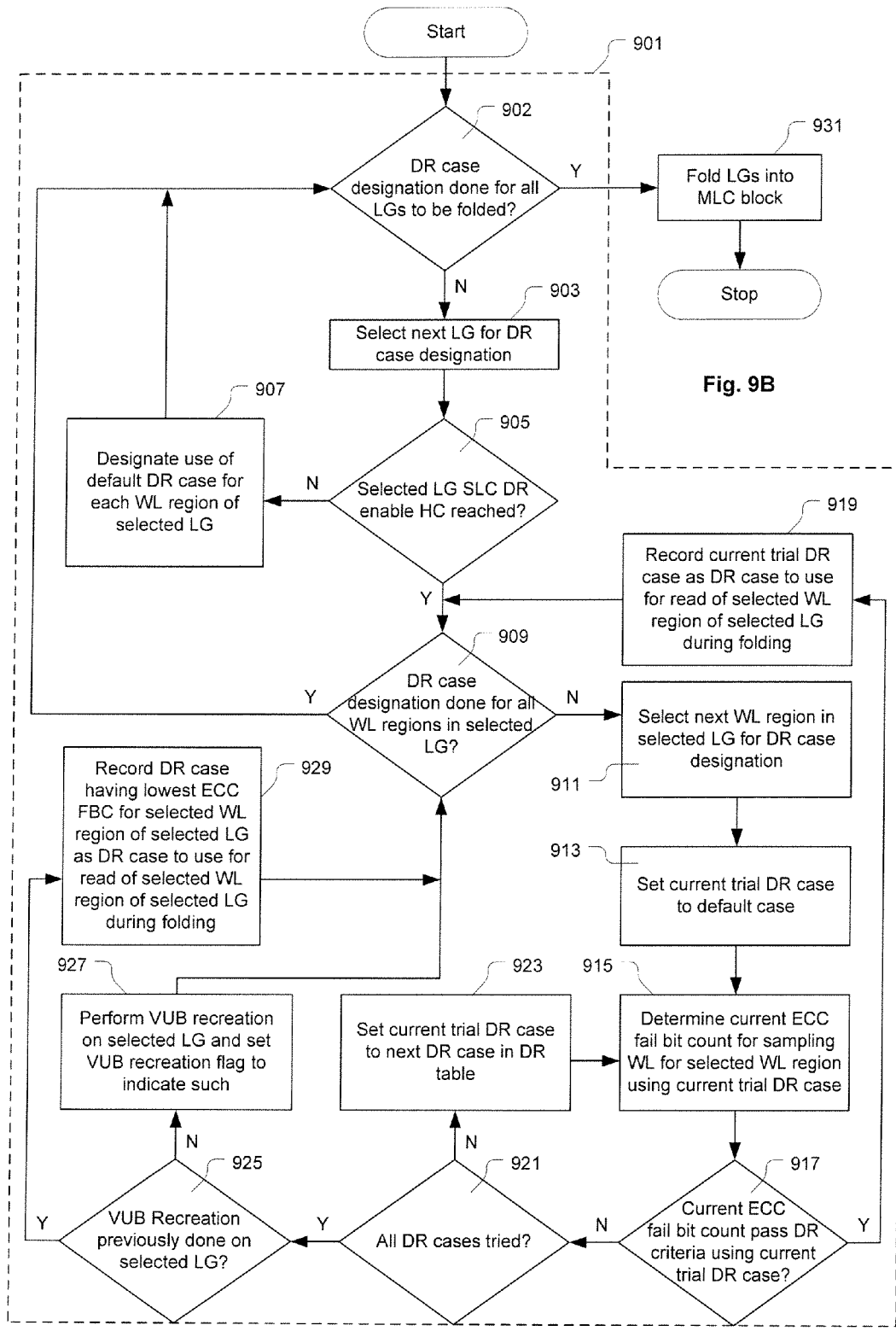
FIG. 9B shows the method of FIG. 9A with an expanded view of operations included in determining the dynamic read case designation for each of multiple wordline regions of each SLC logic group to be folded into the MLC block, in accordance with one embodiment of the present invention.

FIG. 9B shows the method of FIG. 9A with an expanded view of operations included within the operation 901 to determine the dynamic read case designation for each of multiple wordline regions of each SLC logic group to be folded into the MLC block, in accordance with one embodiment of the present invention. The method is initiated with an operation 902 to determine whether or not a dynamic read case designation has been done for all SLC logic groups to be folded into the MLC. If operation 902 determines that the dynamic read case designation has been done for all SLC logic groups to be folded, the method proceeds to the operation 931 in which the SLC logic groups are folded into the MLC block. If the operation 902 determines that the dynamic read case designation has not been done for all SLC logic groups to be folded, the method proceeds with an operation 903 to select a next SLC logic group for dynamic read case designation.

From the operation 903, the method proceeds with an operation 905 for determining whether or not the SLC logic group selected in operation 903 (i.e., the currently selected SLC logic group) has a hot count that has reached a threshold value at which the SLC dynamic read process is enabled. The hot count for a given SLC logic group is a running count of the number of program/erase cycles that the given SLC logic group has undergone during its lifetime. In one embodiment, the hot count threshold value for enabling the SLC dynamic read process is stored as a file system parameter in the firmware of the memory system. In one example embodiment the hot count threshold value for enabling the SLC dynamic read process is 3000 program/erase cycles. However, it should be understood that in other embodiments the hot count threshold value for enabling the SLC dynamic read process can be set at any number of program/erase cycles, as appropriate for the corresponding memory system.

If the operation 905 determines that the hot count of the currently selected SLC logic group has not yet reached, i.e., is less than, the hot count threshold value for enabling the SLC dynamic read process, the method proceeds with an operation 907 in which a default dynamic read case is designated for each wordline region of the currently selected SLC logic group. In one embodiment, the default dynamic read case is the same for each wordline region of each SLC logic group. The default dynamic read case specifies a default voltage to be applied to a given wordline of a given SLC logic group under normal conditions when reading out the SLCs of the given wordline. In one embodiment, such as shown in FIG. 5, the default dynamic read case is designated as case 0 and specifies a wordline read voltage of 0 V. However, it should be understood that in other embodiments, memory structures and conditions may require the default dynamic read case to specify a default wordline read voltage that is either greater than or less than 0V.

From the operation 907, the method proceeds back to the operation 902. Therefore, it should be appreciated that until at least one of the SLC logic groups to be folded has a hot count equal to or greater than the hot count threshold value for enabling the SLC dynamic read process, all of the SLC logic groups to be folded will be read and copied into the MLC block using the default wordline read voltage for reading each wordline in each SLC logic group.

If the operation 905 determines that the hot count of the currently selected SLC logic group has reached, i.e., is greater than or equal to, the hot count threshold value for enabling the SLC dynamic read process, the method proceeds with an operation 909 for determining whether or not a dynamic read case has been designated for all wordline regions in the currently selected SLC logic group. If the operation 909 determines that there is at least one wordline region of the currently selected logic group for which a dynamic read case has not yet been designated, the method proceeds with an operation 911 for selecting a next wordline region, in the currently selected SLC logic group, for which a dynamic read case designation is to be performed. For ease of description, the wordline region selected in operation 911 is referred to as the currently selected wordline region. Also, for description purposes, it should be understood that the currently selected wordline region is within the currently selected SLC logic group.

From the operation 911, the method proceeds with an operation 913 in which a current trial dynamic read case is set to the default dynamic read case, such that a current trial wordline read voltage is set to the wordline read voltage specified by the default dynamic read case. From the operation 913, the method proceeds with an operation 915 in which a current ECC fail bit count is determined for a designated sampling wordline of the currently selected wordline region using the current trial dynamic read case to specify the wordline read voltage. More specifically, in operation 915, the wordline read voltage specified by current trial dynamic read case is used to read out data from the SLCs of the sampling wordline of the currently selected wordline region. Then, this read out data is processed through the ECC engine to determine the current ECC fail bit count within the read out data. The current ECC fail bit count is equal to how many of the SLCs of the sampling wordline of the currently selected wordline region yielded incorrect binary data when read using the wordline read voltage of the current trial dynamic read case.

From the operation 915, the method proceeds with an operation 917 for determining whether or not the current ECC fail bit count as determined in operation 915 passes a dynamic read criteria. The dynamic read criteria specifies a maximum allowable fail bit count when reading out SLCs of a given wordline within a given SLC logic group. Therefore, passing the dynamic read criteria in the operation 915 requires that the current ECC fail bit count be less than the maximum allowable fail bit count of the dynamic read criteria. In one embodiment, the maximum allowable fail bit count of the dynamic read criteria is stored as a file system parameter in the firmware of the memory system. In one example embodiment, the dynamic read criteria specifies a maximum allowable fail bit count of 20 bits. However, it should be understood that in other embodiments the maximum allowable fail bit count of the dynamic read criteria can be set at any number of bits appropriate for the corresponding memory system so as to maintain data integrity.

If the operation 917 determines that the current ECC fail bit count does pass the dynamic read criteria, the method proceeds with an operation 919 to record the current trial dynamic read case as the dynamic read case specifying the wordline read voltage to be used when reading each wordline in the currently selected wordline region of the currently selected logic group during the folding operation. In one embodiment, the recording is performed by storing an address of the current trial dynamic read case in a portion of the memory system that is not involved in the present folding operation and that is designated to store the designated dynamic read case identifier for the currently selected wordline region of the currently selected SLC logic group. It should be understood that in other embodiments, the designated dynamic read case identifier for the currently selected wordline region of the currently selected SLC logic group can be recorded in many different ways so long as it is available to indicate the appropriate wordline read voltage $V_{READ}$ for the currently selected wordline region of the currently selected SLC logic group during the folding operation. From the operation 919, the method reverts back to the operation 909 to determine whether or not a dynamic read case has been designated for all wordline regions in the currently selected SLC logic group.

If the operation 917 determines that the current ECC fail bit count does not pass the dynamic read criteria, i.e., is greater than the maximum allowable fail bit count of the dynamic read criteria, the method proceeds with an operation 921 to determine whether or not all available dynamic read cases have been tried in operation 915. If the operation 921 determines that all available dynamic read cases have not been tried, the method proceeds with an operation 923 to set the current trial dynamic read case to a next dynamic read case in the dynamic read table. For example, with reference to the example dynamic read table of FIG. 5, if the current trial dynamic read case was case 0 upon entering the operation 923, the current trial dynamic read case would be set to 1, and so on. From the operation 923, the method reverts back to the operation 915 to determine the current ECC fail bit count the designated sampling wordline of the currently selected wordline region using the current trial dynamic read case to specify the wordline read voltage.

In this manner, operations 915, 917, 921, and 923 are circuitously performed until either the current ECC fail bit count satisfies the dynamic read criteria, or until all dynamic read cases in the dynamic read table of the file system have been tried and failed to satisfy the dynamic read criteria. As previously discussed, upon first encountering a dynamic read case that allows the current ECC fail bit count to satisfy the dynamic read criteria, that dynamic read case is recorded as the designated dynamic read case for the currently selected wordline region of the currently selected SLC logic group. Because each wordline region of each SLC logic group is processed separately to determine its designated dynamic read case, it should be understood that each wordline region (of the SLC logic groups to be folded) will have its own designated dynamic read case, which will be used to specify the wordline read voltage for use in reading each wordline of that wordline region during the folding process.

If the operation 921 determines that all available dynamic read cases have been tried for the currently selected wordline region of the currently selected logic group, the method proceeds with an operation 925 to determine whether or not a virtual update block (VUB) recreation has been previously performed on the currently selected logic group. In the VUB recreation process, a given SLC logic group is read from its present location and programmed to a new location with processing of the read data through the ECC engine. In this manner, the ECC engine identifies incorrect data bits and corrects them for programming to the new location. It should be appreciated that the VUB recreation process can consume significant memory resources due to the reading, ECC checking, and programming operations involved. Therefore, in one embodiment, the operation 925 is effectively a throttle operation to ensure that one VUB recreation process is performed per logic group during the dynamic read case designation process 901.

If the operation 925 determines that the VUB recreation process has not been previously performed on the currently selected logic group, then the method proceeds with an operation 927 in which the VUB recreation process is performed on the currently selected SLC logic group. Also, upon performing the operation 927, a flag is set to indicate that the VUB recreation process has been performed on the currently selected logic group to enable the determination of operation 925 on a subsequent pass through the method. Also, it should be understood that if the wordline read voltage is not appropriately adjusted during the reading phase of the VUB recreation process, misread data could be processed through the ECC engine and cause programming of incorrect data to the new location. Therefore, when performing the VUB recreation process in operation 927, the dynamic read case having the lowest ECC fail bit count for the currently selected wordline region, as determined by the circuitous performance of operations 915, 917, 921, and 923, is used to specify the wordline read voltage for reading the wordlines of the currently selected wordline region.

Also, when performing the VUB recreation process in operation 927, any dynamic read case designations previously recorded in operation 919 for particular wordline regions are used to specify the wordline read voltage for reading the wordlines of those particular wordline regions. And, when performing the VUB recreation process in operation 927, if a dynamic read case has not yet been designated for a given wordline region through the process 901, the default dynamic read case is used to specify the wordline read voltage for reading the wordlines of the given wordline region. Additionally, if an uncorrectable error correction code (UECC) is encountered during the VUB recreation process in operation 927, the UECC is handled in accordance with normal UECC handling procedures, such as by marking an internal bad sector or by providing indication of a UECC failure. From the operation 927, the method reverts back to the operation 909 to determine whether or not a dynamic read case has been designated for all wordline regions in the currently selected SLC logic group.

If the operation 925 determines that the VUB recreation process has already been performed on the currently selected logic group, then the method proceeds with an operation 929 in which the dynamic read case having the lowest ECC fail bit count for the currently selected wordline region, as determined by the circuitous performance of operations 915, 917, 921, and 923, is recorded as the dynamic read case specifying the wordline read voltage to be used when reading each wordline in the currently selected wordline region of the currently selected logic group during the folding operation. From the operation 929, the method reverts back to the operation 909 to determine whether or not a dynamic read case has been designated for all wordline regions in the currently selected SLC logic group. If the operation 909 determines that the dynamic read case designation has been completed for all wordline regions of the currently selected SLC logic group, the method reverts back to the operation 902 to determine whether or not a dynamic read case designation has been done for all SLC logic groups to be folded into the MLC, and the method continues as previously discussed.

Based on the foregoing, the enhanced dynamic read process with single-level cell logic group segmentation can be implemented as a method for operating a computer memory, in one embodiment of the present invention. The computer memory is a NAND-based Flash memory. The method includes determining a dynamic read case designation for each of multiple wordline regions, respectively, of each of a number of single-level cell logic groups. The dynamic read case designation for any given one of the multiple wordline regions specifies a wordline read voltage to be used in reading memory cells of each wordline within the given one of the multiple wordline regions. The method also includes folding the number of single-level cell logic groups into a multi-level cell block. The folding includes reading the memory cells of each wordline of each of the multiple wordline regions of each of the number of single-level cell logic groups using a wordline read voltage corresponding to the dynamic read case designation, as determined for the wordline region within which the read memory cells reside.

As depicted in FIG. 10, in one example embodiment, the number of single-level cell logic groups is three. Also, as depicted in FIG. 7, in one example embodiment, each single-level cell logic group includes three wordline regions. In one embodiment, a first wordline region of a given single-level cell logic group includes a first three wordlines of the given single-level cell logic group. Also in this embodiment, a last wordline region of the given single-level cell logic group includes a last two wordlines of the given single-level cell logic group. Also in this embodiment, a middle wordline region of the given single-level cell logic group includes all wordlines of the given single-level cell logic group that are not within either the first or last wordline regions of the given single-level cell logic group. In one example embodiment, each of the number of single-level cell logic groups includes 85 wordlines.

In another example embodiment, each single-level cell logic group includes three wordline regions. In this example embodiment, a first of the three wordline regions includes a number of wordlines selected from a first quarter of the wordlines of the single-level cell logic group. Also in this example embodiment, a third of the three wordline regions includes a number of wordlines selected from a last quarter of the wordlines of the single-level cell logic group. And, in this example embodiment, a second of the three wordline regions includes all wordlines of the single-level cell logic group that are not within either the first or second wordline regions.

It should be understood that determining the dynamic read case designation for a given wordline region includes determining a wordline read voltage that when applied to read memory cells of a sampling wordline of the given wordline region will yield a fail bit count less than a fail bit count limit. The fail bit count is determined by putting data read from the memory cells of the sampling wordline through an error correction code checking process. Also, the determined wordline read voltage is one of a series of wordline read voltages specified for a corresponding ordered set of dynamic read cases, such as depicted in the example dynamic read case table of FIG. 5.

Along one branch, the method includes determining that no available dynamic read case designation provides a wordline read voltage that when applied to read memory cells of the sampling wordline of the given wordline region will yield a fail bit count less than the fail bit count limit. Also along this branch, the method includes determining that a virtual update block recreation process has not been previously performed on the single-level cell logic group within which the given wordline region exists. And, along this branch, the method includes performing the virtual update block recreation process on the single-level cell logic group within which the given wordline region exists. In one embodiment, the virtual update block recreation process uses a wordline read voltage, for the given wordline region, that when applied to read memory cells of the sampling wordline of the given wordline region yielded a lowest fail bit count.

Along another branch, the method includes determining that no available dynamic read case designation provides a wordline read voltage that when applied to read memory cells of the sampling wordline of the given wordline region will yield a fail bit count less than the fail bit count limit. Also along this branch, the method includes determining that a virtual update block recreation process has already been performed on the single-level cell logic group within which the given wordline region exists. And, along this branch, the method includes designating a best performing dynamic read case for use in reading the given wordline region during the folding. The best performing dynamic read case specifies a wordline read voltage that when applied to read memory cells of the sampling wordline of the given wordline region yielded a lowest fail bit count.

The enhanced dynamic read process with single-level cell logic group segmentation is supported by a method for provisioning a computer memory, in accordance with one embodiment of the present invention. The computer memory is a NAND-based Flash memory. The method includes segmenting a single-level cell logic group into multiple wordline regions. The method also includes storing a specification of the multiple wordline regions as file system parameters in a firmware of the computer memory. The method also includes designating a sampling wordline for each of the multiple wordline regions. The sampling wordline of a given wordline region is to be used during performance of a dynamic read process on the given wordline region. And, the method includes storing a specification of the designated sampling wordline for each of the multiple wordline regions in the firmware of the computer memory.

In one embodiment, the single-level cell logic group is segmented into three wordline regions. A first of the three wordline regions includes a first three wordlines of the single-level cell logic group. A third of the three wordline regions includes a last two wordlines of the single-level cell logic group. And, a second of the three wordline regions includes all wordlines of the single-level cell logic group that are not within either the first or second wordline regions.

Figure 11:
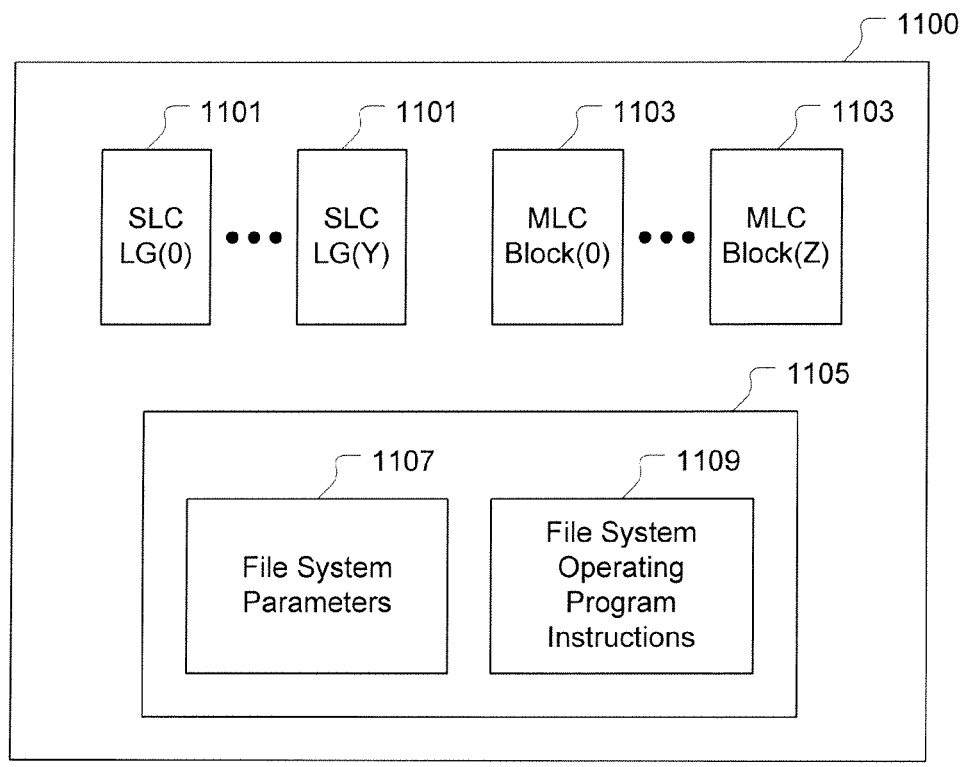
FIG. 11 shows a diagram of a computer memory system equipped to implement the enhanced dynamic read process with single-level cell logic group segmentation as disclosed herein, in accordance with one embodiment of the present invention.

FIG. 11 shows a diagram of a computer memory system 1100 equipped to implement the enhanced dynamic read process with single-level cell logic group segmentation as disclosed herein, in accordance with one embodiment of the present invention. The computer memory system 1100 includes a NAND-based memory structure including single-level cell logic groups 1101 and multi-level cell blocks 1103. The computer memory system 1100 also includes a non-volatile memory 1105 having firmware data stored therein. The firmware data includes file system parameter values 1107 and file system operating program instructions 1109. The file system parameter values 1107 include a specification of multiple wordline regions for each of the single-level cell logic groups and a specification of a sampling wordline for each of the multiple wordline regions.

The file system operating program instructions 1109 are defined to respectively determine a dynamic read case designation for each of the multiple wordline regions of a number of the single-level cell logic groups by reading the sampling wordlines for the multiple wordline regions as specified in the file system parameters. The file system operating program instructions 1109 are also defined to fold the number of the single-level cell logic groups into one of the multi-level cell blocks. The folding includes reading memory cells of each wordline of each of the multiple wordline regions of each of the number of the single-level cell logic groups using a wordline read voltage corresponding to the dynamic read case designation determined for the wordline region within which the read memory cells reside.

It should be understood that the dynamic read case designation for any given one of the multiple wordline regions specifies a wordline read voltage to be used in reading memory cells of each wordline within the given one of the multiple wordline regions. Also, it should be understood that the dynamic read case designation determined for a given wordline region specifies a wordline read voltage that when applied to read memory cells of a sampling wordline of the given wordline region will yield a fail bit count less than a fail bit count limit. Also, it should be understood that the fail bit count is determined by putting data read from the memory cells of the sampling wordline through an error correction code checking process.

It should be appreciated that the enhanced dynamic read process with logic group segmentation has a very low impact on performance, by simply requiring the sampling of a different wordline for each wordline region of the logic group, as opposed to sampling one wordline for the entire logic group. And, it should be appreciated that the enhanced dynamic read process with logic group segmentation provides for better tracking and management of variation in memory cell threshold voltage VTH distribution across the wordlines of the entire logic group. And, it should be appreciated that the enhanced dynamic read process with logic group segmentation does not cause data loss.

The invention described herein can be embodied as computer readable code on a non-transitory computer readable medium. The non-transitory computer readable medium mentioned herein is any data storage device that can store data which can thereafter be read by a computer system. Examples of the non-transitory computer readable medium include hard drives, network attached storage (NAS), read-only memory, random-access memory, CD-ROMs, CD-Rs, CD-RWs, solid-state digital data storage devices, magnetic tapes, and other optical and non-optical data storage devices. The non-transitory computer readable medium can also be multiple data storage devices distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the memory system implementing the enhanced dynamic read process as disclosed herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for operating a computer memory, comprising:
   determining a dynamic read case designation for each of multiple wordline regions, respectively, of each of a number of single-level cell logic groups, the dynamic read case designation for any given one of the multiple wordline regions specifying a wordline read voltage to be used in reading memory cells of each wordline within the given one of the multiple wordline regions,
   wherein determining the dynamic read case designation for a given wordline region includes determining a wordline read voltage that when applied to read memory cells of a sampling wordline of the given wordline region will yield a fail bit count less than a fail bit count limit, wherein the memory cells of the sampling wordline of the given wordline region are used to store normal operational data, and wherein the fail bit count is determined by putting data read from the memory cells of the sampling wordline through an error correction code checking process; and
   folding the number of single-level cell logic groups into a multi-level cell block, the folding including reading the memory cells of each wordline of each of the multiple wordline regions of each of the number of single-level cell logic groups using a wordline read voltage corresponding to the dynamic read case designation as determined for the wordline region within which the read memory cells reside.

2. The method as recited in claim 1, wherein the number of single-level cell logic groups is three.

3. The method as recited in claim 2, wherein each single-level cell logic group includes three wordline regions.

4. The method as recited in claim 3, further comprising:
   accessing a file system to read parameter values to determine wordline boundaries of each of the three wordline regions.

5. The method as recited in claim 4, wherein each of the number of single-level cell logic groups includes 85 wordlines.

6. The method as recited in claim 1, wherein the determined wordline read voltage is one of a series of wordline read voltages specified for a corresponding ordered set of dynamic read cases.

7. The method as recited in claim 6, further comprising:
   determining that no available dynamic read case designation provides a wordline read voltage that when applied to read memory cells of the sampling wordline of the given wordline region will yield a fail bit count less than the fail bit count limit;
   determining that a virtual update block recreation process has not been previously performed on the single-level cell logic group within which the given wordline region exists; and
   performing the virtual update block recreation process on the single-level cell logic group within which the given wordline region exists.

8. The method as recited in claim 7, wherein the virtual update block recreation process uses a wordline read voltage, for the given wordline region, that when applied to read memory cells of the sampling wordline of the given wordline region yielded a lowest fail bit count.

9. The method as recited in claim 6, further comprising:
determining that no available dynamic read case designation provides a wordline read voltage that when applied to read memory cells of the sampling wordline of the given wordline region will yield a fail bit count less than the fail bit count limit;
determining that a virtual update block recreation process has already been performed on the single-level cell logic group within which the given wordline region exists; and
designating a best performing dynamic read case for use in reading the given wordline region during the folding, the best performing dynamic read case specifying a wordline read voltage that when applied to read memory cells of the sampling wordline of the given wordline region yielded a lowest fail bit count.

10. The method as recited in claim 1, wherein the computer memory is a NAND-based Flash memory.

11. A method for provisioning a computer memory, comprising:
segmenting a single-level cell logic group into multiple wordline regions;
storing a specification of the multiple wordline regions as file system parameters in a firmware of the computer memory;
designating sampling wordlines for the multiple wordline regions such that each of the multiple wordline regions has one designated sampling wordline, and such that each sampling wordline is included within the wordline region for which it is designated, wherein each sampling wordline is used to store normal operational data,
wherein the sampling wordline of a given wordline region is designated for use during performance of a dynamic read process on the given wordline region, wherein performing the dynamic read process on the given wordline region includes determining a wordline read voltage that when applied to read memory cells of the sampling wordline of the given wordline region will yield a fail bit count less than a fail bit count limit, wherein the fail bit count is determined by putting data read from the memory cells of the sampling wordline through an error correction code checking process, the determined wordline read voltage being stored as a dynamic read case designation for the given wordline region such that the determined wordline read voltage is used in reading memory cells of each wordline within the given wordline region; and
storing a specification of the designated sampling wordline for each of the multiple wordline regions in the firmware of the computer memory.

12. The method as recited in claim 11, wherein the computer memory is a NAND-based Flash memory.

13. The method as recited in claim 11, wherein the single-level cell logic group is segmented into three wordline regions.

14. The method as recited in claim 13, wherein a first of the three wordline regions includes a number of wordlines selected from a first quarter of the wordlines of the single-level cell logic group, wherein a third of the three wordline regions includes a number of wordlines selected from a last quarter of the wordlines of the single-level cell logic group, and wherein a second of the three wordline regions includes all wordlines of the single-level cell logic group that are not within either the first or second wordline regions.

15. A computer memory system, comprising:
a NAND-based memory structure including single-level cell logic groups and multi-level cell blocks;
a non-volatile memory having firmware data stored therein, the firmware data including file system parameter values and file system operating program instructions, the file system parameter values include a specification of multiple wordline regions for each of the single-level cell logic groups, the file system parameter values also including a specification of sampling wordlines for the multiple wordline regions such that each of the multiple wordline regions has one designated sampling wordline, and such that each sampling wordline is included within the wordline region for which it is designated, wherein each sampling wordline is used to store normal operational data,
the file system operating program instructions defined to respectively determine a dynamic read case designation for each of the multiple wordline regions of a number of the single-level cell logic groups, wherein determining the dynamic read case designation for a given wordline region includes determining a wordline read voltage that when applied to read memory cells of the sampling wordline of the given wordline region will yield a fail bit count less than a fail bit count limit, wherein the fail bit count is determined by putting data read from the memory cells of the sampling wordline through an error correction code checking process,
the file system operating program instructions defined to fold the number of the single-level cell logic groups into one of the multi-level cell blocks, the folding including reading memory cells of each wordline of each of the multiple wordline regions of each of the number of the single-level cell logic groups using a wordline read voltage corresponding to the dynamic read case designation determined for the wordline region within which the read memory cells reside.

16. The computer memory system as recited in claim 15, wherein the dynamic read case designation for any given one of the multiple wordline regions specifies a wordline read voltage to be used in reading memory cells of each wordline within the given one of the multiple wordline regions.

17. The computer memory system as recited in claim 15, wherein each single-level cell logic group is segmented into three wordline regions.

18. The computer memory system as recited in claim 17, wherein a first of the three wordline regions includes a number of wordlines selected from a first quarter of the wordlines of the single-level cell logic group, wherein a third of the three wordline regions includes a number of wordlines selected from a last quarter of the wordlines of the single-level cell logic group, and wherein a second of the three wordline regions includes all wordlines of the single-level cell logic group that are not within either the first or second wordline regions.

19. The computer memory system as recited in claim 15, wherein the file system operating program instructions are defined to identify when no available dynamic read case designation provides a corresponding wordline read voltage that when applied to read memory cells of the sampling wordline of a given wordline region will yield a fail bit count less than the fail bit count limit, and in response determine that a virtual update block recreation process has not been previously performed on the single-level cell logic group within which the given wordline region exists, and in response perform the virtual update block recreation process on the single-level cell logic group within which the given wordline region exists.

20. The computer memory system as recited in claim 15, wherein the file system operating program instructions are defined to identify when no available dynamic read case designation provides a corresponding wordline read voltage that when applied to read memory cells of the sampling wordline of a given wordline region will yield a fail bit count less than the fail bit count limit, and in response determine that a virtual update block recreation process has already been performed on the single-level cell logic group within which the given wordline region exists, and in response designate a best performing dynamic read case for use in reading the given wordline region during the folding, the best performing dynamic read case specifying a wordline read voltage that when applied to read memory cells of the sampling wordline of the given wordline region yielded a lowest fail bit count.

* * * * *